US011626474B2

(12) United States Patent
Leng et al.

(10) Patent No.: US 11,626,474 B2
(45) Date of Patent: Apr. 11, 2023

(54) THIN-FILM RESISTOR (TFR) WITH IMPROVED CONTACTS

(71) Applicant: Microchip Technology Incorporated, Chandler, AZ (US)

(72) Inventors: Yaojian Leng, Portland, OR (US); Justin Sato, West Linn, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/170,975

(22) Filed: Feb. 9, 2021

(65) Prior Publication Data

US 2022/0208954 A1 Jun. 30, 2022

Related U.S. Application Data

(60) Provisional application No. 63/133,008, filed on Dec. 31, 2020.

(51) Int. Cl.
*H01L 49/02* (2006.01)
(52) U.S. Cl.
CPC .................. *H01L 28/24* (2013.01)
(58) Field of Classification Search
CPC ... H01L 23/647; H01L 23/62; H01L 23/5228; H01L 23/49827; H01L 23/5226; H01L 28/20–24
See application file for complete search history.

(56) References Cited

U.S. PATENT DOCUMENTS

| 10,553,336 B2 | 2/2020 | Leng et al. |
| 10,818,748 B2 | 10/2020 | Leng et al. |
| 2011/0177668 A1 | 7/2011 | Yeh et al. ............. 438/384 |
| 2013/0093055 A1 | 4/2013 | Lee ..................... 257/536 |
| 2014/0217550 A1* | 8/2014 | Zuo ............ H01L 28/20 257/536 |
| 2015/0162396 A1 | 6/2015 | Yagi et al. ............ 257/532 |
| 2019/0386091 A1* | 12/2019 | Sato ............ H01L 21/76802 |
| 2019/0392967 A1* | 12/2019 | Leng ............ H01C 17/075 |

FOREIGN PATENT DOCUMENTS

EP 2423948 A2 2/2012 ........... H01L 23/522

OTHER PUBLICATIONS

International Search Report and Written Opinion, Application No. PCT/US2021/039563, 11 pages.

* cited by examiner

*Primary Examiner* — Jesse Y Miyoshi
(74) *Attorney, Agent, or Firm* — Slayden Grubert Beard PLLC

(57) ABSTRACT

A thin film resistor (TFR) module is formed in an integrated circuit device. The TFR module includes a TFR element connected between first and second vertically-extending TFR side contacts. The TFR element includes a base portion extending laterally between the TFR side contacts, and first and second TFR element end flanges projecting vertically from opposing ends of the base portion. The first TFR element end flange is formed on a sidewall of the first TFR side contact, and the second TFR element end flange is formed on a sidewall of the second TFR side contact. A first TFR head contacts the first TFR side contact and a top of the first TFR element end flange, and a second TFR head contacts the second TFR side contact and a top of the second TFR element end flange, thus defining two parallel conductive paths between the TFR element and each TFR head.

13 Claims, 12 Drawing Sheets

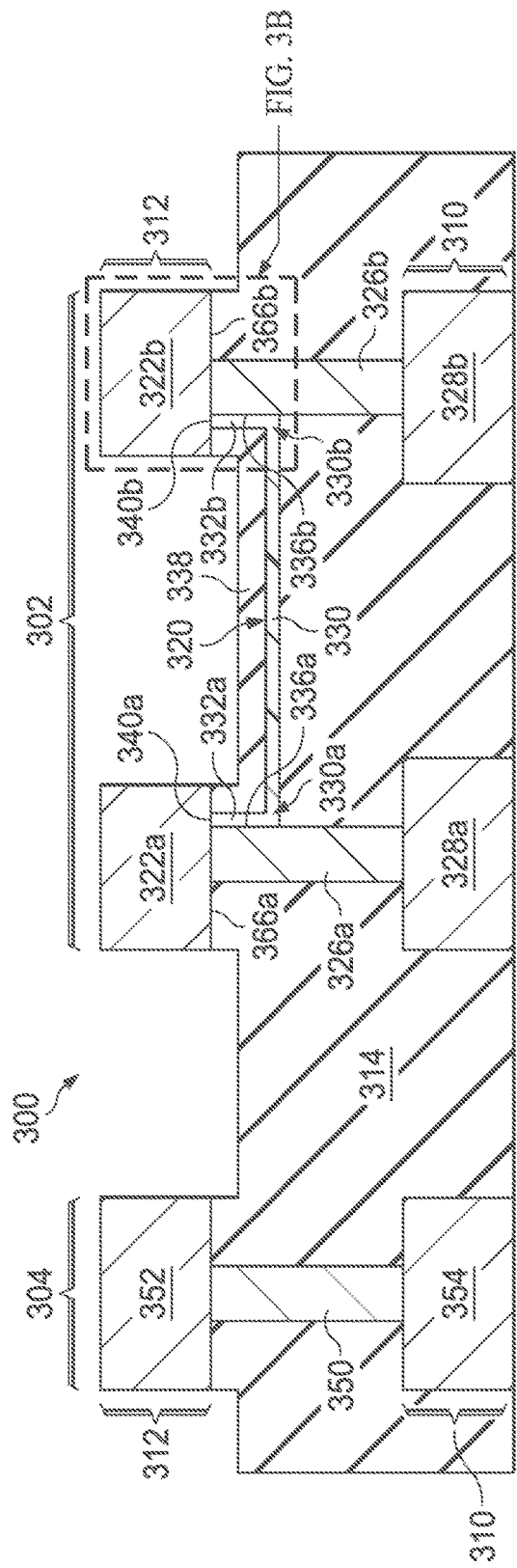
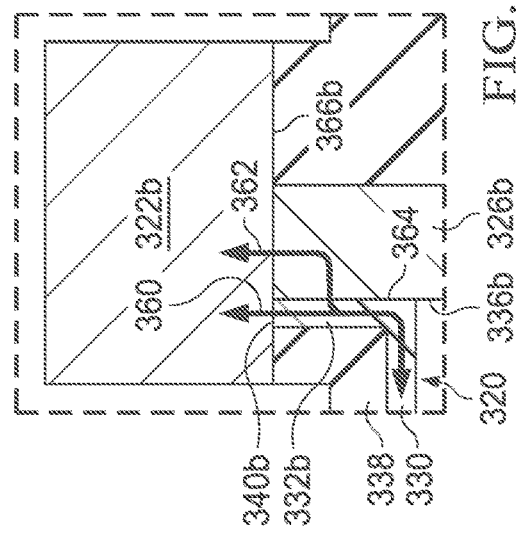
FIG. 3A
FIG. 3B

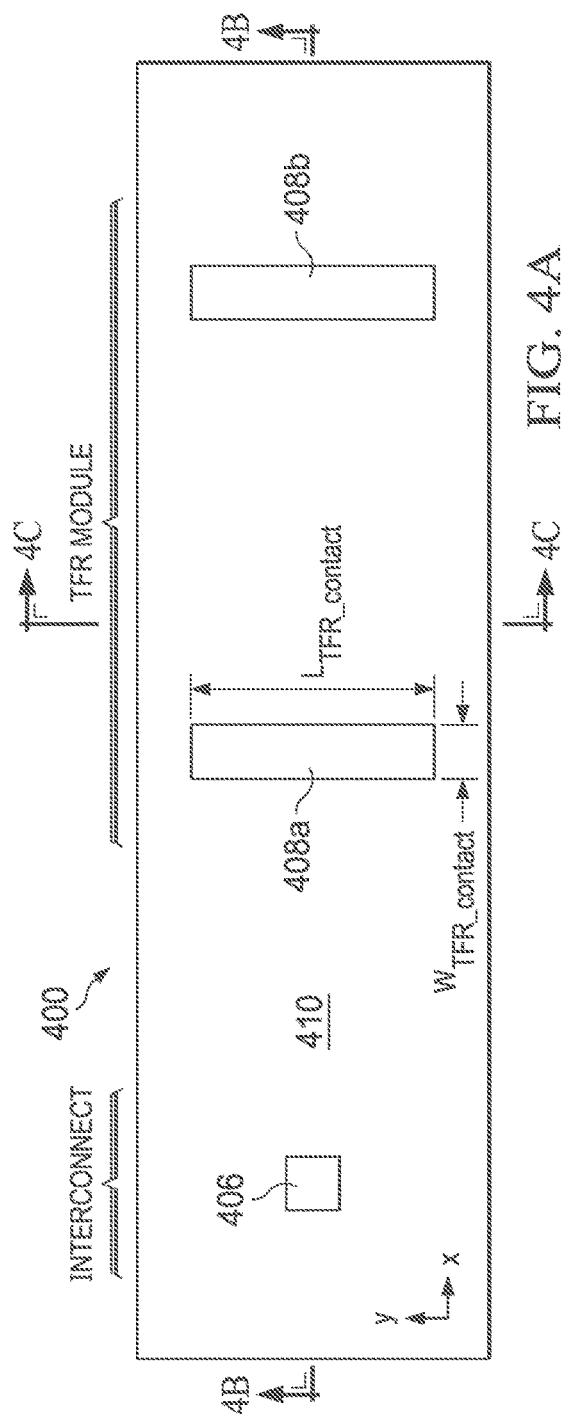
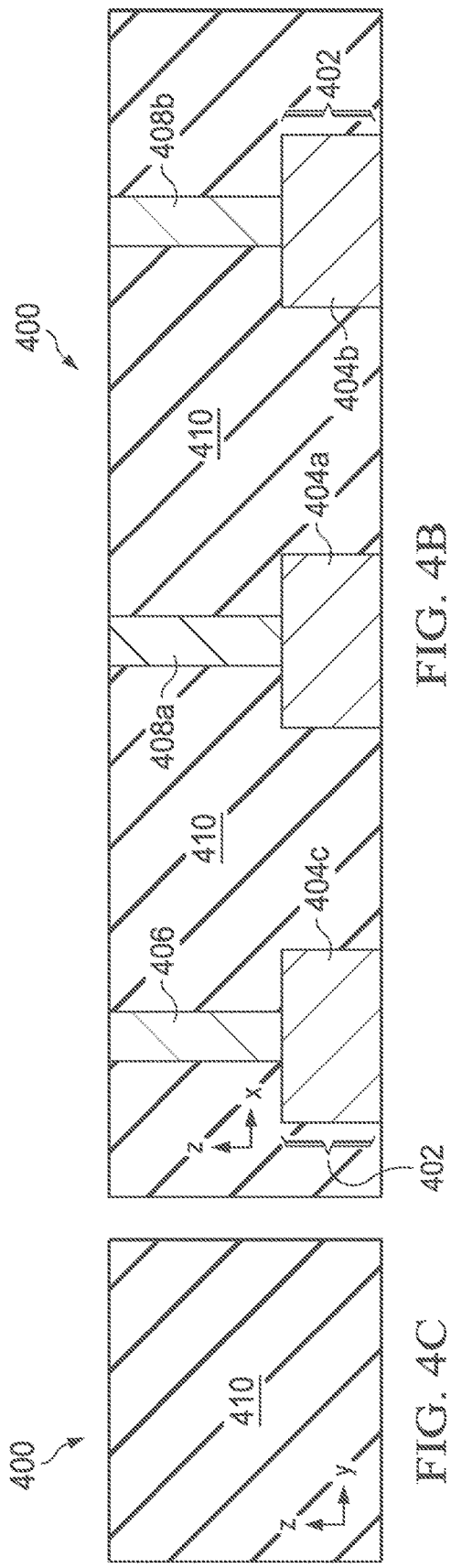
FIG. 4A
FIG. 4B
FIG. 4C

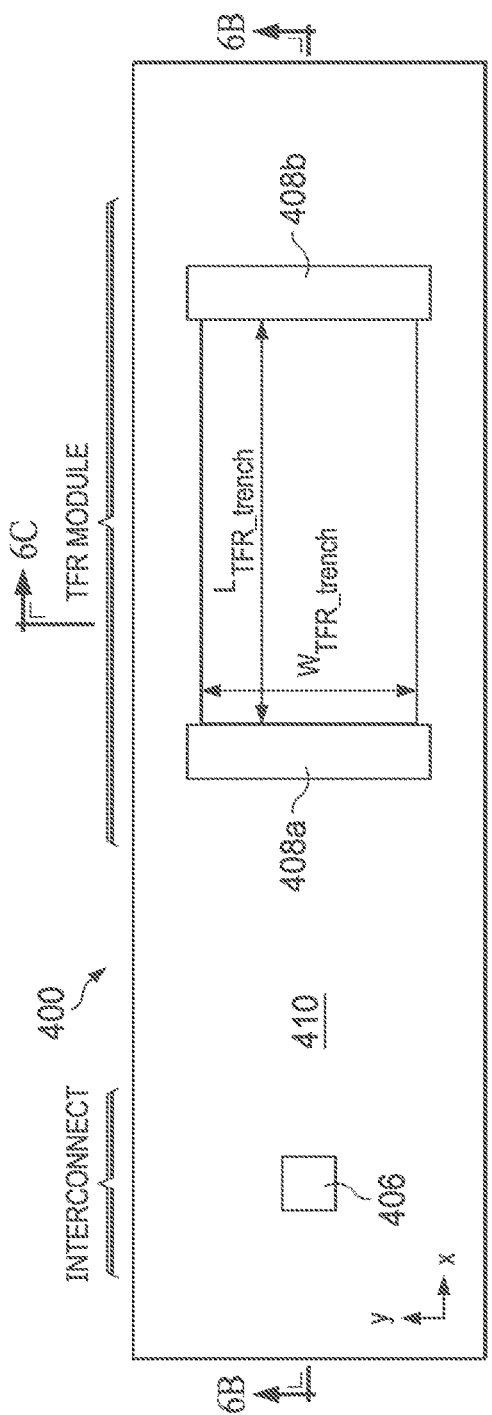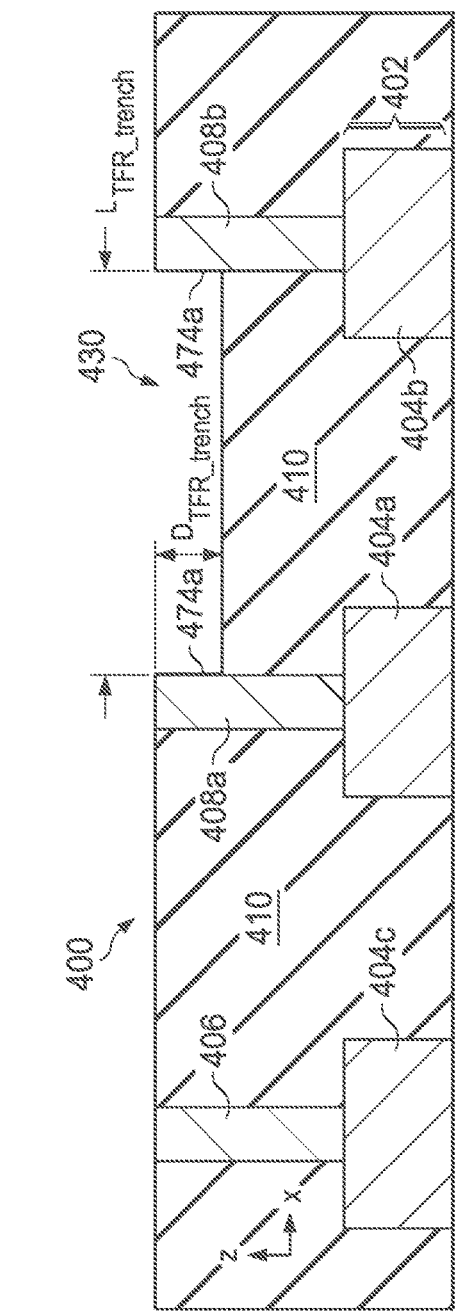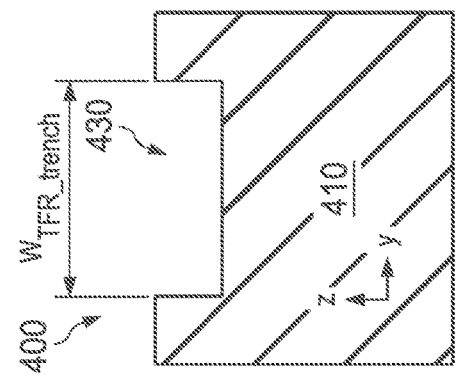
FIG. 6A
FIG. 6B
FIG. 6C

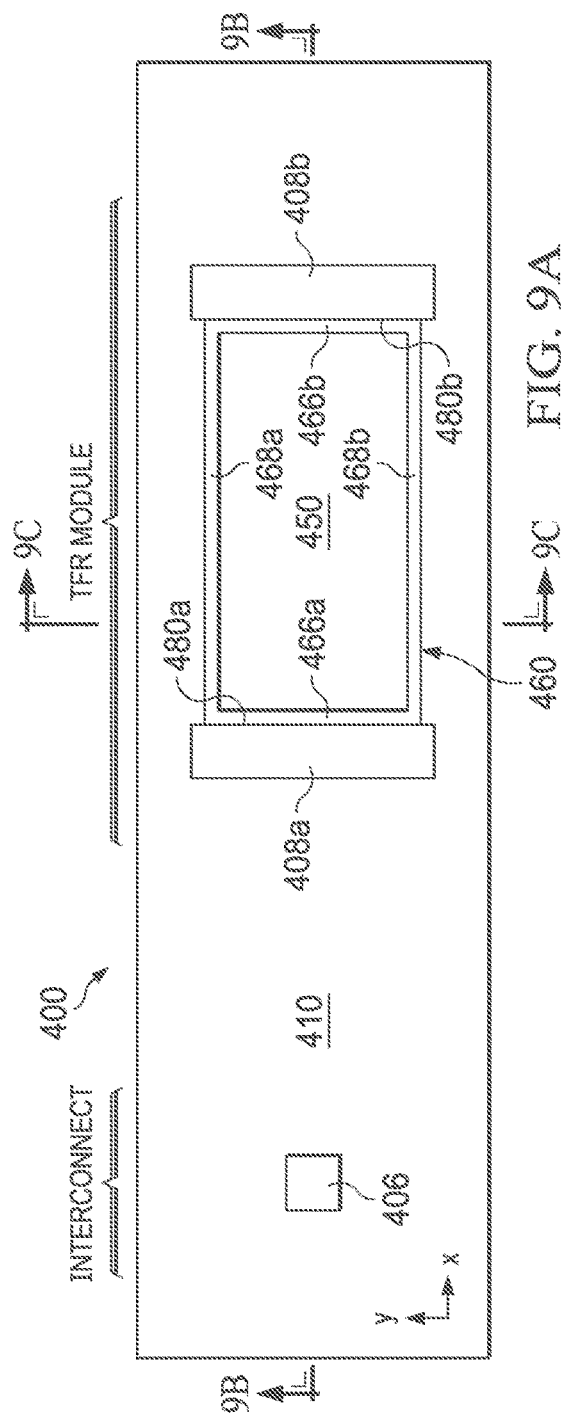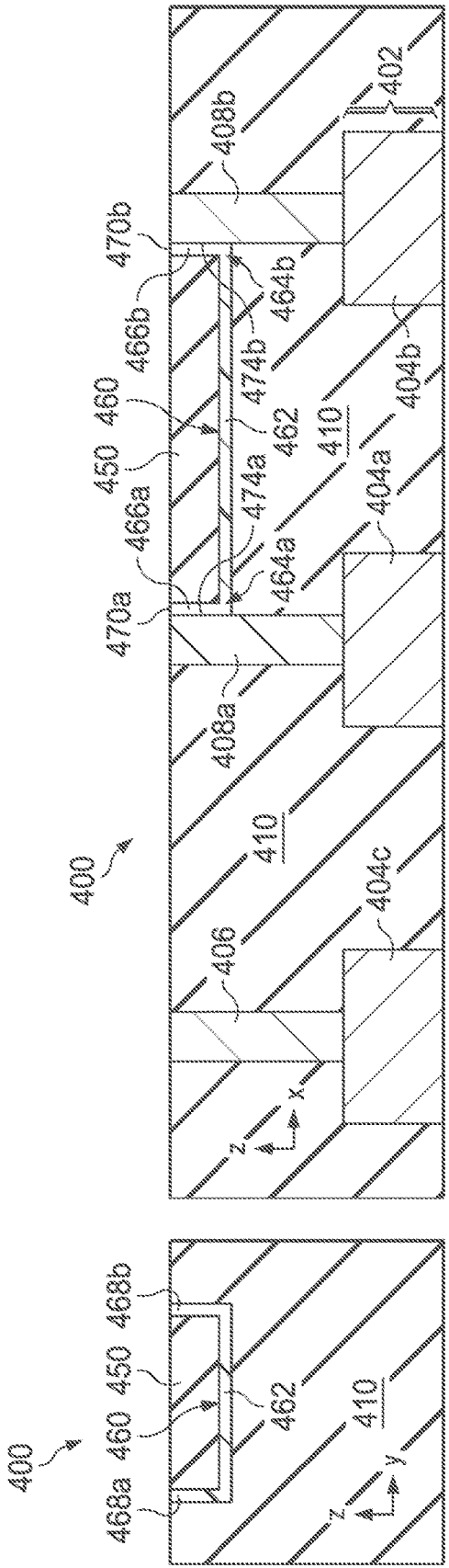
FIG. 9A
FIG. 9B
FIG. 9C

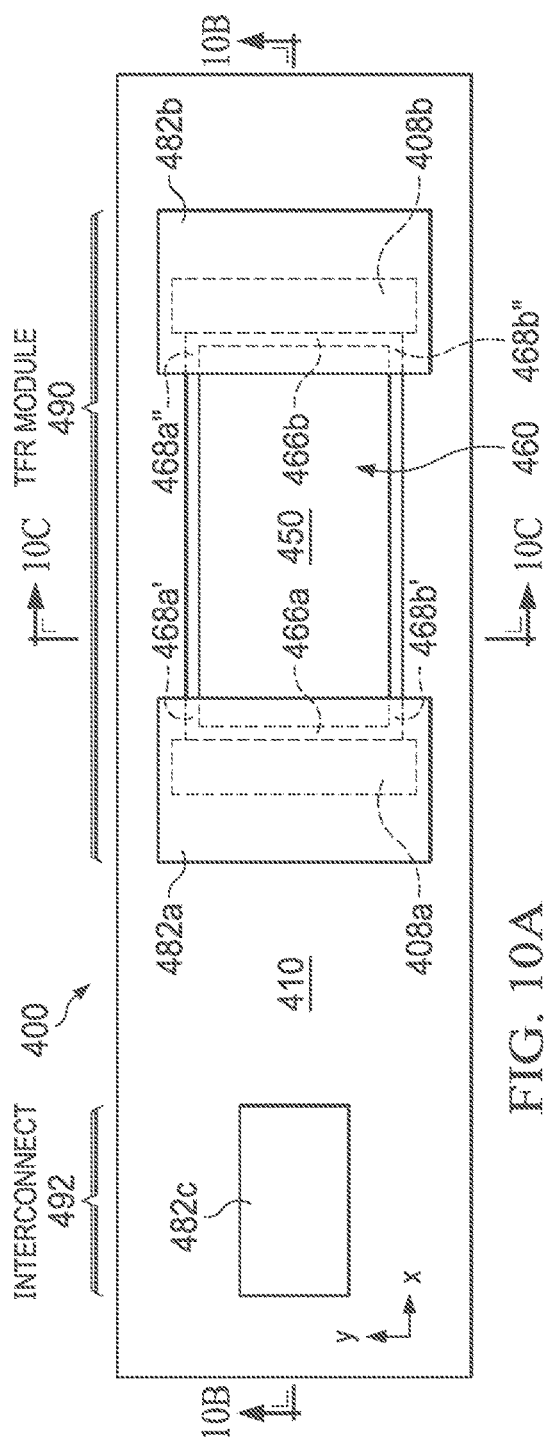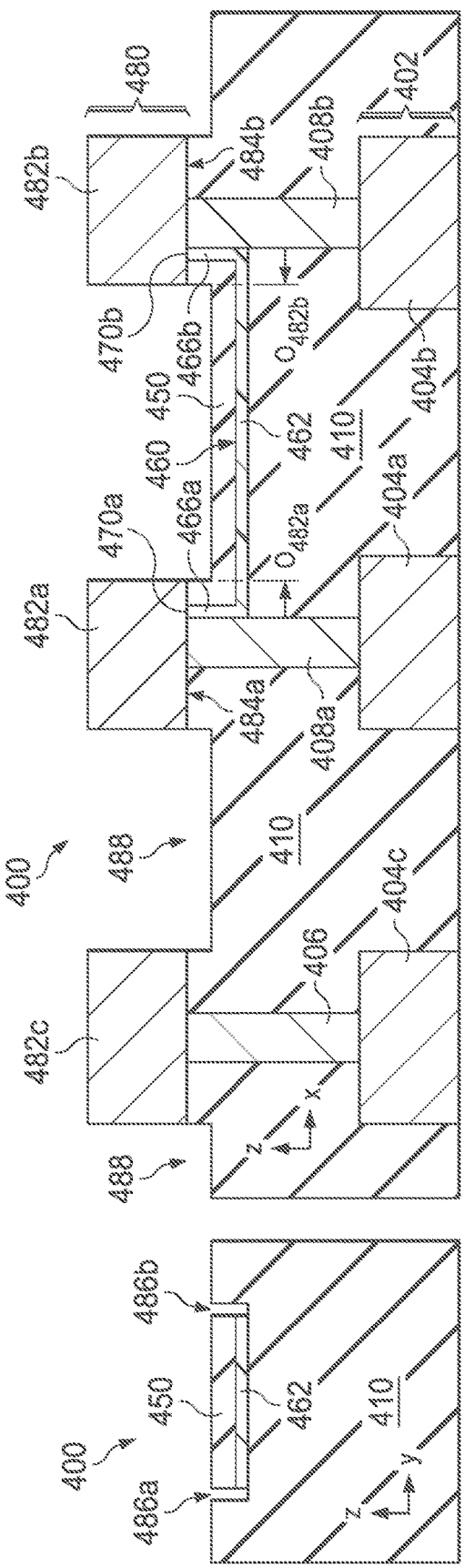
FIG. 10A
FIG. 10B
FIG. 10C

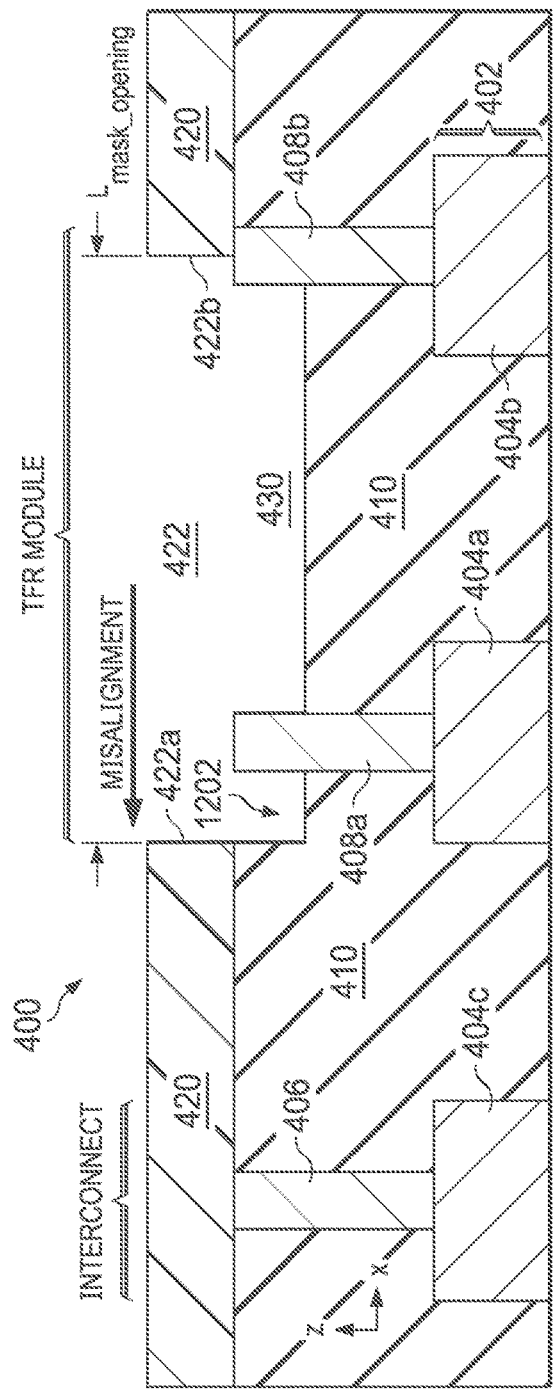
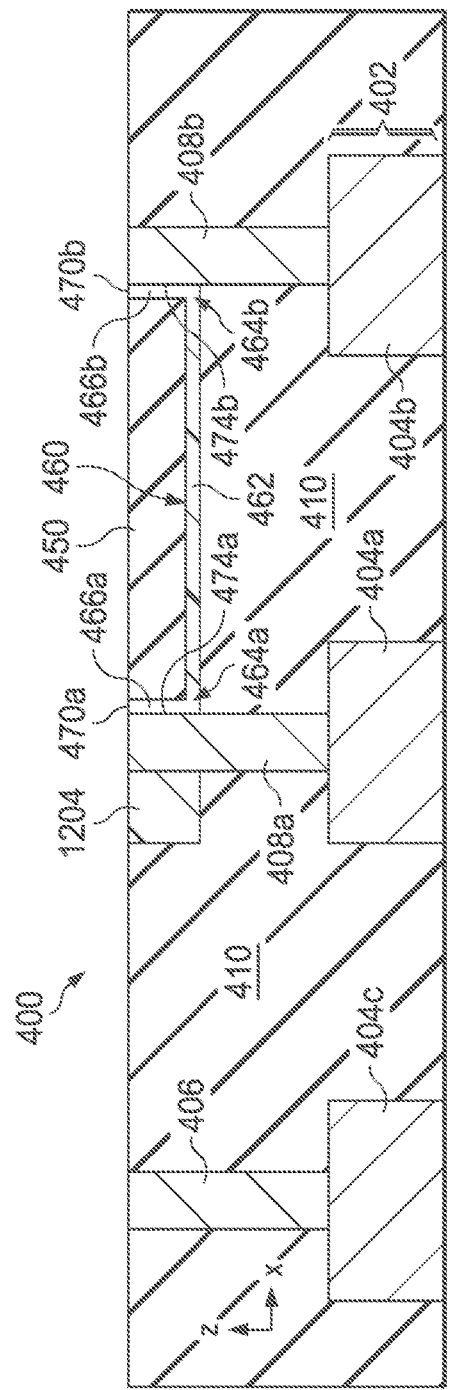
FIG. 12A
FIG. 12B

THIN-FILM RESISTOR (TFR) WITH IMPROVED CONTACTS

RELATED APPLICATION

This application claims priority to commonly owned U.S. Provisional Patent Application No. 63/133,008 filed Dec. 31, 2020, the entire contents of which are hereby incorporated by reference for all purposes.

TECHNICAL FIELD

The present disclosure relates to thin-film resistors (TFRs), in particular to TFR modules formed in interconnect layers of integrated circuit (IC) devices, and methods for manufacturing such TFR modules.

BACKGROUND

Semiconductor integrated circuits (IC) typically include metallization layers used to connect various components of the IC, called interconnect, or back end of line (BEOL) elements. Copper is often preferred over aluminum due to its lower resistivity and higher electromigration resistance. Electrical resistance is generally referred to herein as "resistance" for convenience. Copper interconnect, however, is typically difficult to manufacture with traditional photoresist masking and plasma etching used for aluminum interconnect.

One known technique for forming copper interconnects on an IC is known as additive patterning, sometimes called a damascene process, which refers to traditional metal inlaying techniques. A so-called damascene process may include patterning dielectric materials, such as silicon dioxide, or fluorosilicate glass (FSG), or organo-silicate glass (OSG) with open trenches where the copper or other metal conductors should be. A copper diffusion barrier layer (typically Ta, TaN, or a bi-layer of both) is deposited, followed by a deposited copper seed layer, followed by a bulk Copper fill, e.g., using an electro-chemical plating process. A chemical-mechanical planarization (CMP) process may then be used to remove any excessive copper and barrier, and may thus be referred to as a copper CMIP process. The copper remaining in the trench functions as a conductor. A dielectric barrier layer, e.g., SiN or SiC, is then typically deposited over the wafer to prevent copper corrosion and improve device reliability. A similar damascene process can be used to form integrated TFR modules.

With more features being packed into individual semiconductor chips, there is an increased need to pack passive components, such as resistors, into the circuits. Some resistors can be created through ion implantation and diffusion, such as poly resistors. However, such resistors typically have high variations in resistance value, and may also have resistance values that change drastically as a function of temperature. A new way to construct integrated resistors, called Thin-Film Resistors (TFRs) has been introduced in the industry to improve integrated resistor performance. Known TFRs are typically formed from SiCr (silicon-chromium), SiCCr (silicon-silicon carbide-chromium), TaN (tantalum nitride), NiCr (nickel-chromium), AlNiCr (aluminum-doped nickel-chromium), or TiNiCr (titanium-nickel-chromium), for example.

FIGS. 1A and 1B show cross-sectional views of two example TFR devices 10A and 10B, respectively, implemented using conventional processes. Fabrication of conventional TFR devices 10A and 10B typically requires three added mask layers. A first added mask layer is used to create the TFR heads 12A and 12B. A second added mask layer is used to create TFR elements 14A and 14B in respective contact with TFR heads 12A and 12B. A third added mask layer is used to create TFR vias 16A and 16B in contact with TFR heads 12A and 12B. As shown, TFR elements 14A and 14B are formed across the top and bottom of TFR heads 12A and 12B, respectively, but in each case three added mask layers are typically required.

FIGS. 1A and 1B also indicate the areas at which TFR elements 14A and 14B contact the respective TFR heads 12A and 12B. As shown, TFR element 14A contacts top surfaces of TFR heads 12A and 12B, while TFR element 14B contacts bottom surfaces of TFR heads 12A and 12B. Electrical resistance at these TFR contact areas, referred to herein as "contact resistance," provides a component of the overall TFR device resistance. Low contact resistance is generally desired in TFR design, so that the overall TFR device resistance is dominated by the shape of TFR element. However, the TFR contact areas in the conventional TFR devices 10A and 10B often provide a relatively high and/or unreliable contact resistance. For example, the TFR contact area with each TFR head 12A and 12B may be relatively small. Moreover, contact resistance can vary significantly as a function of process variations, especially for very thin TFR elements. For example, a TFR element may comprise an SiCr, SiCCr, NiCr, or TaN film having a thickness of less than 100 Å for a sheet resistance of about 1 KΩ/square (1 KΩ/□). TFR contact reliability, and its effect on TFR resistance, is a common concern in TFR designs.

FIG. 2 shows a representation of an example TFR device 200 to illustrate various resistance calculations. The view of example TFR device 200 shown in FIG. 2 may represent a top-down view of the TFR device 10A shown in FIG. 1A or a bottom-up view of the TFR device 10B shown in FIG. 1B. As shown, TFR device 200 includes a TFR element 202 (e.g., TFR film) extending from a first end 204 in contact with a first TFR head 210 at a first TFR contact area 220, and a second end 206 in contact with a second TFR head 212 at a second TFR contact area 222. First and second ends 204 and 206 of the TFR element 202 may be in contact with top or bottom surfaces of TFR heads 210 and 212, respectively, depending on whether TFR device 200 corresponds with the configuration of TFR device 10A shown in FIG. 1A or TFR device 10B shown in FIG. 1B.

The TFR element 202 has a length L extending between TFR heads 210 and 212, and a width W. The length L is illustrated as being made up of a number of divisions, with each division having a length equal to W, thus forming a number of W×W squares. The resistance of the TFR element 202, $R_{TFR\_element}$, can be expressed by Equation (1):

$$R_{TFR\_element} = Rs * L/W \quad (1)$$

wherein Rs is the sheet resistance of the TFR element 202, which is defined by the resistivity (p) of the TFR element 202 (a material property dependent on the material selected for the TFR element 202) and the thickness (t) of the TFR element 202 in a direction into the page (Rs=ρ/t).

With reference to FIG. 2 and Equation (1), the TFR element resistance $R_{TFR\_element}$ is proportional to the number of W×W squares along the length L of the TFR element 202.

A total resistance $R_{TFR\_device}$ for the TFR device 200 includes the TFR element resistance $R_{TFR\_element}$ in series with a contact resistance at each TFR contact area 220, 222. Thus, the total TFR device resistance $R_{TFR\_device}$ can be expressed by Equation (2):

$$R_{TFR\_device} = R_{TFR\_element} + R_{TFR\_contact\_area\_220} + R_{TFR\_contact\_area\_222} \quad (2)$$

TFR contact resistance, such as the resistance at each TFR contact area 220, 222 ($R_{TFR\_contact\_area\_220}$ and $R_{TFR\_contact\_area\_222}$), may vary significantly as a function of manufacturing process variations, providing an unpredictable resistance. In addition, the temperature coefficient of resistance (TCR) at each TFR contact area 220, 222 is typically uncontrollable. Accordingly, it would typically be desirable, from a design perspective, to minimize or reduce the TFR contact resistance, such that the TFR device performance (resistance and TCR) is dominated by well-characterized properties of the TFR element itself.

There is therefore a need for improved integrated TFR devices, also referred to herein as "TFR modules," and methods of construction. For example, there is a need for integrated TFR modules having improved contact between the TFR element and TFR heads, to provide lower and more reliable contact resistance. There is also a need in some applications for TFR modules with a sheet resistance of about 1 kΩ/square and a low temperature coefficient of resistance (TCR) (e.g., absolute value close to 0), which enables improved designs of integrated circuits, particularly with analog components.

SUMMARY

Embodiments of the present disclosure provide improved thin-film resistors (TFRs), which may be integrated in IC devices in a modular manner and thus referred to herein as "TFR modules." More particularly, embodiments of the present disclosure provide TFR modules including a TFR element extending laterally between two vertically-extending TFR side contacts (e.g., elongated vias) that are each contacted by a respective TFR head, wherein the TFR element includes TFR element end flanges in contact with the vertically-extending TFR side contacts. In particular, the TFR element includes a first TFR element end flange at one lateral end of the TFR element and a second TFR element end flange at an opposite lateral end of the TFR element. The first TFR element end flange extends parallel to, and is in contact, with one of the vertically-extending TFR side contacts, and the second TFR element end flange extends parallel to, and is in contact with, the other vertically-extending TFR side contact. The contact between the respective TFR element end flanges and vertically-extending TFR side contacts (which are in turn connected to the TFR heads) may provide an increased contact area for the TFR element, which may reduce contact resistance and improve contact reliability between the TFR element and the TFR heads.

In addition, the TFR module may be formed such that a distal end of each TFR element end flange directly contacts a bottom surface of a respective TFR head, to thereby provide two contacts between each TFR element end flange and a respective TFR head: (1) contact between the TFR element end flange and a vertically-extending TFR side contact in contact with the respective TFR head and (b) direct contact between the distal end of the TFR element end flange and the respective TFR head. This dual contact design may define two parallel resistance paths between the TFR element and each TFR head, which may further reduce contact resistance and improve contact reliability, as a failure of either one of the two contacts will not cause a TFR module failure.

In some embodiments, such TFR modules with reduced contact resistance may be formed in damascene structures of an IC device. For example, some embodiments provide methods of forming TFR modules using damascene techniques including only one added mask layer to the background fabrication process for the IC device. The TFR modules can be formed at any level of interconnect (e.g., at any metal layer) in the IC device. In some embodiments such TFR modules are formed with a sheet resistance of about 1 kΩ/square and a low temperature coefficient of resistance (TCR) (e.g., absolute value close to 0).

One aspect of the invention provides a method of forming a thin film resistor (TFR) module in an integrated circuit (IC) structure. First and second vertically-extending TFR side contacts are formed spaced apart from each other. A TFR element is formed between the first and second vertically-extending TFR side contacts. The TFR element includes (a) a laterally-extending TFR element base extending from a first end proximate the first vertically-extending TFR side contact to a second end proximate the second vertically-extending TFR side contact, (b) a first TFR element end flange projecting vertically from the first end of the TFR element base, the first TFR element end flange extending parallel to, and in contact with, the first vertically-extending TFR side contact, and (c) a second TFR element end flange projecting vertically from the second end of the TFR element base, the second TFR element end flange extending parallel to, and in contact with, the second vertically-extending TFR side contact. A first TFR head is formed in contact with the first vertically-extending TFR side contact, and a second TFR head is formed in contact with the second vertically-extending TFR side contact.

In some embodiments, the TFR element comprises SiCr, SiCCr, NiCr, or TaN.

In one embodiment, the method includes forming the first TFR head such that a bottom surface of the first TFR head is in contact with the first TFR element end flange; and forming the second TFR head such that a bottom surface of the second TFR head is in contact with the second TFR element end flange.

In one embodiment, the method includes forming the first TFR head such that a bottom surface of the first TFR head is in contact with both (a) the first vertically-extending TFR side contact and (b) the first TFR element end flange; and forming the second TFR head such that a bottom surface of the second TFR head is in contact with both (a) the second vertically-extending TFR side contact and (b) the second TFR element end flange.

In one embodiment, the TFR element also includes TFR element side flanges projecting vertically from the TFR element base and extending between the first and second TFR element end flanges, and the method includes removing at least a partial height of each TFR element side flange.

In one embodiment, the method includes performing a metal etch to both (a) define the first and second TFR heads and (b) remove the at least partial height of each TFR element side flanges.

In one embodiment, forming the first and second vertically-extending TFR side contacts includes forming first and second elongated via openings, and filling the first and second elongated via openings with metal.

In one embodiment, forming the TFR element includes (a) removing a partial thickness of a non-conductive region between the first and second vertically-extending TFR side contacts to define a TFR opening exposing a first sidewall of the first vertically-extending TFR side contact and a second sidewall of the second vertically-extending TFR side contact, and (b) depositing a TFR film in the TFR opening, the deposited TFR film including (i) a first TFR film portion covering a top surface of the non-conductive region between the first and second vertically-extending TFR side contacts, the first TFR film portion defining the laterally-extending TFR element base, (ii) a second TFR film portion covering the exposed first sidewall of the first vertically-extending TFR side contact, the second TFR film portion defining the first TFR element end flange, and (iii) a third TFR film portion covering the exposed second sidewall of the second vertically-extending TFR side contact, the third TFR film portion defining the second TFR element end flange.

Another aspect of the invention provides a TFR module formed in an IC device structure. The TFR module includes a first and second vertically-extending TFR side contacts spaced apart from each other, a TFR element, and first and second TFR heads. The TFR element includes (a) a laterally-extending TFR element base extending from a first end proximate the first vertically-extending TFR side contact to a second end proximate the second vertically-extending TFR side contact, (b) a first TFR element end flange projecting vertically from the first end of the TFR element base, the first TFR element end flange extending parallel and in contact with the first vertically-extending TFR side contact, and (c) a second TFR element end flange projecting vertically from the second end of the TFR element base, the second TFR element end flange extending parallel and in contact with the second vertically-extending TFR side contact. The first TFR head is in contact with the first vertically-extending TFR side contact, and the second TFR head is in contact with the second vertically-extending TFR side contact.

In some embodiments, the TFR element comprises SiCr, SiCCr, NiCr, or TaN.

In one embodiment, a bottom surface of the first TFR head is in contact with the first TFR element end flange, and a bottom surface of the second TFR head is in contact with the second TFR element end flange.

In one embodiment, a bottom surface of the first TFR head is in contact with both (a) the first vertically-extending TFR side contact and (b) the first TFR element end flange, and a bottom surface of the second TFR head is in contact with both (a) the second vertically-extending TFR side contact and (b) the second TFR element end flange.

In one embodiment, the TFR element also includes TFR element side flanges projecting vertically from the TFR element base and extending between the first and second TFR element end flanges, wherein a vertical height of each TFR element side flange is less than a vertical height of each of the first and the second TFR element end flanges.

In one embodiment, each of the first and second vertically-extending TFR side contacts comprises an elongated metal via.

Another aspect of the invention provides a method of forming an IC device including a TFR module and an interconnect structure. The method includes concurrently forming (a) a via and (b) first and second vertically-extending TFR side contacts. The method further includes forming a TFR element between the first and second vertically-extending TFR side contacts, the TFR element including (a) a laterally-extending TFR element base extending from a first end proximate the first vertically-extending TFR side contact to a second end proximate the second vertically-extending TFR side contact, and (b) a first TFR element end flange projecting vertically from the first end of the TFR element base, the first TFR element end flange extending parallel and in contact with the first vertically-extending TFR side contact, and (c) a second TFR element end flange projecting vertically from the second end of the TFR element base, the second TFR element end flange extending parallel and in contact with the second vertically-extending TFR side contact. The method further includes concurrently forming (a) a metal line in contact with the via, (b) a first TFR head in contact with the first vertically-extending TFR side contact, and (c) a second TFR head in contact with the second vertically-extending TFR side contact.

In one embodiment, each of the first and second vertically-extending TFR side contacts comprises an elongated metal via.

In one embodiment, each of the first and second vertically-extending TFR side contacts has a TFR side contact width in a first lateral direction equal to a width of the via, and a TFR side contact length in a second lateral direction at least twice as large as the TFR side contact width.

In one embodiment, the method includes forming the first TFR head such that a bottom surface of the first TFR head is in contact with the first TFR element end flange, and forming the second TFR head such that a bottom surface of the second TFR head is in contact with the second TFR element end flange.

In one embodiment, forming the TFR element further includes forming TFR element side flanges projecting vertically from the TFR element base and extending between the first and second TFR element end flanges, and removing at least a partial height of the TFR element side flanges. In one embodiment, a metal etch is performed to (a) form the metal line in contact with the via, (b) form the first and second TFR heads and (c) remove the at least partial height of the TFR element side flanges.

BRIEF DESCRIPTION OF THE DRAWINGS

Example aspects of the present disclosure are described below in conjunction with the figures, in which:

FIG. 3A is a cross-sectional side view of an IC device structure including an example TFR module formed near a typical metal interconnect structure, according to one embodiment of the present invention;

FIG. 3B is an enlarged view of one end of the TFR module shown in FIG. 3A, showing two parallel conductive paths between one end of the TFR element and a respective TFR head, according to one embodiment of the present invention;

FIGS. 4A-10C illustrate an example process for forming an IC device structure including an example TFR module and metal interconnect structure, according to one embodiment of the invention;

FIGS. 12A-12B are cross-sectional side views showing an example misalignment of a patterned mask opening for forming a TFR trench (FIG. 12A), and showing the absence of a negative effect of such misalignment on the resulting TFR element (FIG. 12B), according to another example implementation.

Figure 1A:
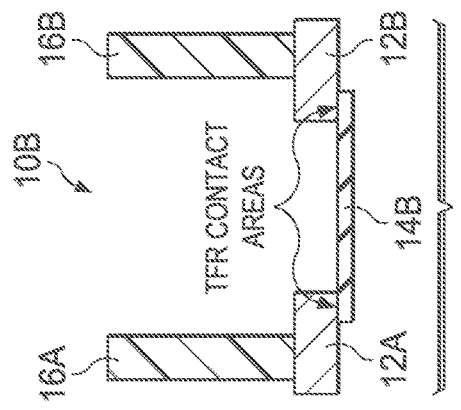
FIGS. 1A and 1B are a cross-sectional views of two example thin-film resistor (TFR) devices implemented using known processes.
Figure 1B:
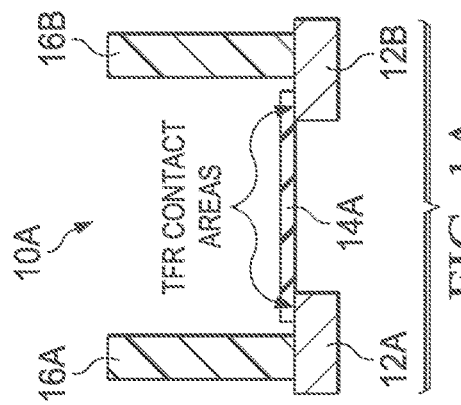
Figure 2:
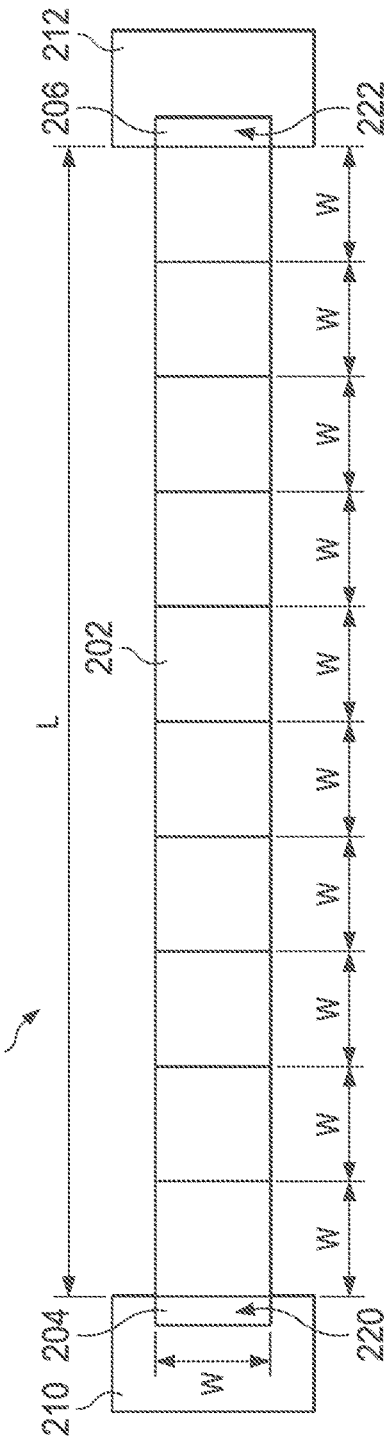
FIG. 2 is a cross-sectional view of a known integrated circuit (IC) structure including an example TFR formed according to known techniques.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Embodiments of the present invention provide a TFR module formed in an IC device, and methods of forming such a TFR module. The TFR module includes a TFR element connected between first and second vertically-extending TFR side contacts. The TFR element may include a laterally-extending base portion extending between the vertically-extending TFR side contacts, and first and second vertically-extending flanges projecting vertically (e.g., upwardly) from opposing ends of the base portion. The first vertically-extending flange may be formed on a sidewall of the first vertically-extending TFR side contact, and the second vertically-extending flange may be formed on a sidewall of the second vertically-extending TFR side contact. A first TFR head may be formed in contact with the first TFR side contact and a top end of the first TFR element vertical flange, and a second TFR head may be formed in contact with the second TFR side contact and a top end of the second TFR element vertical flange, thus defining two parallel conductive paths between the TFR element and each TFR head, which may reduce contact resistance and improve contact reliability.

FIG. 3A is a cross-sectional side view of an IC device structure 300 including a TFR module 302 having a TFR element 320 formed near a metal interconnect structure 304, according to one embodiment of the present invention. FIG. 3B is an enlarged view of one end of TFR module 302, showing two parallel conductive paths between one end of the TFR element 320 and a respective TFR head 322b.

As shown in FIGS. 3A and 3B, TFR module 302 and metal interconnect structure 304 are formed in common layers of the IC device structure 300, including a first metal layer 310, a second metal layer 312, and a dielectric region 314 (e.g., comprising one or more oxide layers). Thus, TFR module 302 may be formed concurrently with metal interconnect structure 304 and other structures of IC device structure 300. As discussed below, TFR module 302 may be formed at any depth in IC device structure 300, i.e. between any two metal layers.

The example metal interconnect structure 304 may comprise a via contact including a via 350 connecting a metal line 352 formed in the second metal layer 312 with a metal line 354 formed in the underlying first metal layer 310.

The TFR module 302 may include a TFR element 320 formed between a pair of TFR heads 322a and 322b, and a pair of vertically-extending TFR side contacts 326a and 326b connecting the respective TFR heads 322a and 322b to underlying metal lines 328a and 328b, which underlying metal lines 328a, 328b are formed in the underlying first metal layer 310. TFR heads 322a and 322b are formed in the second metal layer 312. Each vertically-extending TFR side contact 326a and 326b may be elongated in a direction into the page, e.g., in the form of a widened or "slotted" via, as discussed below with reference to FIGS. 4A and 4B. TFR element 320 may be formed using a damascene process including a chemical mechanical planarization (CMP) process. Elements 326a and 326b are referred to as "vertically-extending TFR side contacts" because vertically-extending flanges of the TFR element 320 contact sidewalls of vertically-extending TFR side contacts 326a and 326b, as discussed below.

As shown in FIG. 3A, the TFR element 320 includes (a) a laterally-extending TFR element base 330 extending from a first end 330a proximate a first vertically-extending TFR side contact 326a to a second end 330b proximate a second vertically-extending TFR side contact 326b and (b) TFR element end flanges 332a and 332b each projecting vertically from the first end 330a and second end 330b, respectively of the TFR element base 330. First TFR element end flange 332a is formed on a sidewall 336a of vertically-extending TFR side contact 326a, and the TFR element end flange 332b is formed on a sidewall 336b of vertically-extending TFR side contact 326b.

The TFR element 320 may comprise a conductive film, e.g., formed from SiCCr, SiCr, NiCr, TaN, or other suitable TFR material. A protective cap 338, e.g., comprising SiN or SiO2, may be formed over the TFR element 320, as discussed below in more detail.

As shown, the TFR module 302 may be formed such that a top (distal) end 340a of the TFR element end flange 332a is in contact with a bottom surface 366a of TFR head 322a, and a top (distal) end 340b of the TFR element end flange 332b is in contact with a bottom surface 366b of TFR head 322b. Thus, each TFR element end flange 332a, 332b contacts an associated TFR head 322a, 322b through two parallel conductive paths: (1) a first (direct) conductive contact path through direct contact between the respective top (distal) end 340a, 340b of each TFR element end flange 322a, 322b and associated TFR head 322a, 322b, and (2) a second (indirect) conductive contact path between each TFR element end flange 322a, 322b and associated TFR head 322a, 322b via the associated vertically-extending TFR side contacts 326a, 326b.

FIG. 3B provides a more detailed view of the two conductive contact paths between TFR element end flange 332b and TFR head 322b. As shown, the top end 340b of TFR element end flange 332b is in direct contact with the bottom surface 366b of TFR head 322b, and a sidewall 364 of TFR element end flange 332b is in contact with sidewall 336b of vertically-extending TFR side contact 326b. This configuration defines (a) a first (direct) conductive path 360 between the top end 340b of TFR element end flange 332b and bottom surface 366b of TFR head 322b and (b) a second (indirect) conductive path 362 extending from TFR element end flange 332b, through the interface between sidewall 364 of TFR element end flange 332b and sidewall 336b of vertically-extending TFR side contact 326b, and through vertically-extending TFR side contact 326b to TFR head 322b. Conductive paths 360 and 362 are electrically in parallel. Thus, conductive paths 360 and 362 define two parallel contact resistances between the TFR element 320 and TFR head 322b: (1) a first resistance, $R_{TFR\ flange\ top-TFR\ head}$, associated with the first (direct) conductive contact path 360 and (2) a second resistance, $R_{TFR\ flange-TFR\ side\ contact-TFR\ head}$, associated with the second (indirect) conductive contact path 362. Similar parallel conductive paths and parallel contact resistances are defined between the TFR element end flange 332a and TFR head 322a.

Based on the parallel conductive paths (and associated parallel resistances) discussed above, the contact resistance between the between the TFR element 320 and each respective TFR head 322a and 322b $R_{contact:TFR\ flange\ top-TFR\ head}$, may be represented by the parallel resistance calculation shown in Equation (3):

$$1/R_{contact:TFR\ flange\ top\text{-}TFR\ head} = 1/R_{TFR\ flange\ top\text{-}TFR\ head} + 1/R_{TFR\ flange\text{-}TFR\ side\ contact\text{-}TFR\ head} \quad (3)$$

As illustrated by Equation (3), the parallel conductive paths (and parallel resistances) may reduce the contact resistance ($R_{contact:TFR\ element\text{-}TFR\ head}$) at each end of the TFR element 320, as the contact resistance ($R_{contact:TFR\ element\text{-}TFR\ head}$) is lower than each of the two parallel resistance components ($R_{TFR\ flange\ top\text{-}TFR\ head}$ and $R_{TFR\ flange\text{-}TFR\ side\ contact\text{-}TFR\ head}$) individually. In addition, the parallel conductive contact paths may improve the contact reliability for the TFR module 302, as the TFR module 320 may continue to operate even with a failure of one of conductive paths 360 and 362 between the TFR element 320 and a TFR head 322a or 322b.

FIGS. 4A-10C illustrate an example process for forming an example IC device structure 400 including an example TFR module and metal interconnect structure, which may correspond with the example TFR module 302 and metal interconnect structure 304 shown in FIGS. 3A-3B, according to one embodiment of the invention. The figures are arranged in groups of three (FIGS. 4A-4C, FIGS. 5A-5C, etc.), with each group of three figures including (a) a top view (e.g., FIG. 4A, FIG. 5A, etc.), (b) a first cross-sectional side view (e.g., FIG. 4B, FIG. 5B, etc.), and (c) a second cross-sectional side view (e.g., FIG. 4C, FIG. 5C, etc.).

Turning first to FIGS. 4A-4C, FIG. 4A shows a top view, FIG. 4B shows a first cross-sectional side through cut line 4B-4B shown in FIG. 4A, and FIG. 4C shows a second cross-sectional side view through cut line 4C-4C shown in FIG. 4A. As shown, the process may start by forming a metal layer 402 including metal lines 404a, 404b and 404c, and forming a via 406 and vertically-extending TFR side contacts 408a and 408b over and in contact with respective metal lines 404a-404c. Metal layer 402 may be any metal layer (e.g., interconnect layer) at any depth in the IC device structure 400 being formed. Via 406 and TFR side contacts 408a, 408b may be formed in a dielectric region 410 including one or more oxide layers and/or other dielectric layer(s).

Via 406 may comprise a conventional via formed using conventional techniques. Each vertically-extending TFR side contact 408a, 408b may be elongated in a lateral direction, in this example the y-direction, to provide a continuous structure for contacting a vertically-extending flange of a subsequently formed TFR element, as discussed below with reference to FIGS. 10A-10B. For example, each vertically-extending TFR side contact 408a, 408b may have a width $W_{TFR\_contact}$ in the x-direction, and an elongated length $L_{TFR\_contact}$ in the y-direction that is at least 2 times, at least 4 times, at least 6 times, at least 8 times, or at least 10 times the width $W_{TFR\_contact}$. In sone embodiments, each vertically-extending TFR side contact 408a, 408b may have a width $W_{TFR\_contact}$ in the range of 0.1-0.5 μm, and length $L_{TFR\_contact}$ in the range of 1-100 μm. Via 406 and vertically-extending TFR side contacts 408a, 408b may be formed simultaneously, by forming respective openings in the dielectric region 410, filling the openings with tungsten or other suitable metal, and performing a CMP to arrive at the structure shown in FIGS. 4A-4C. In one embodiment, each vertically-extending TFR side contacts 408a, 408b may be formed by forming an elongated via opening (elongated in the y-direction), using the same via mask as the conventional via opening for via 406, and simultaneously filling the elongated and conventional via openings.

Figure 5A:
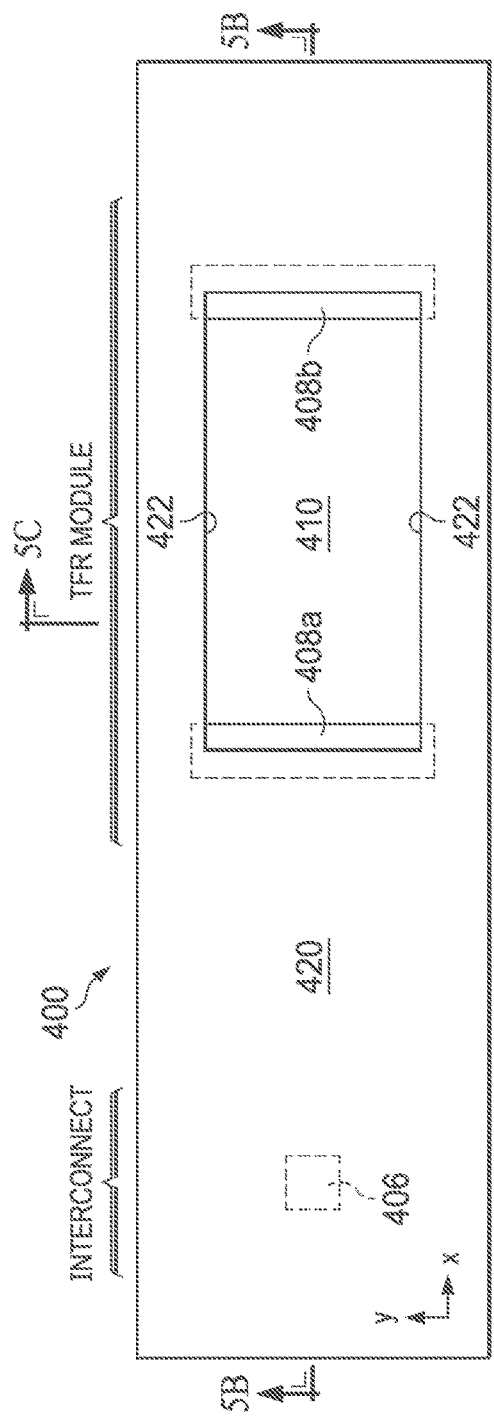
Figure 5B:
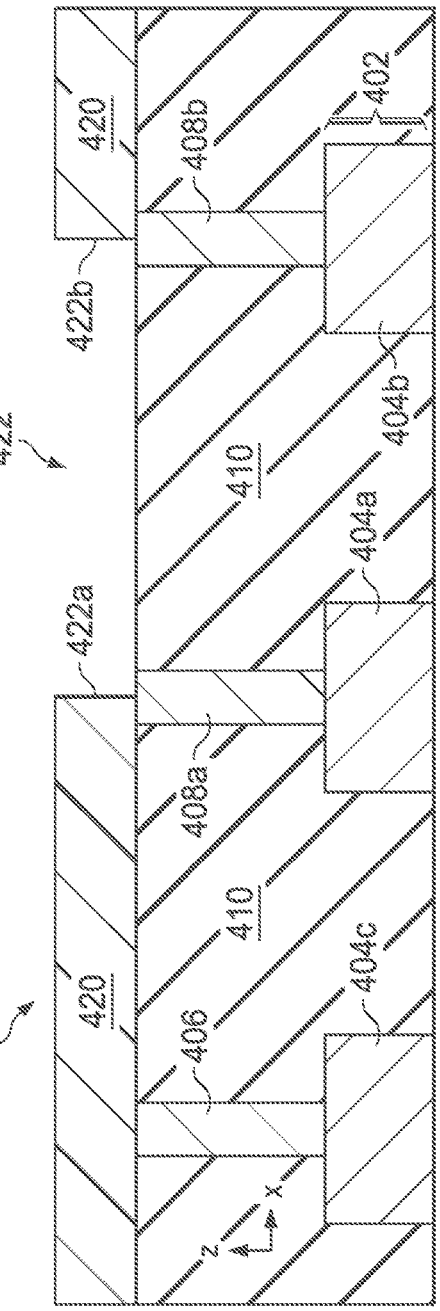
Figure 5C:
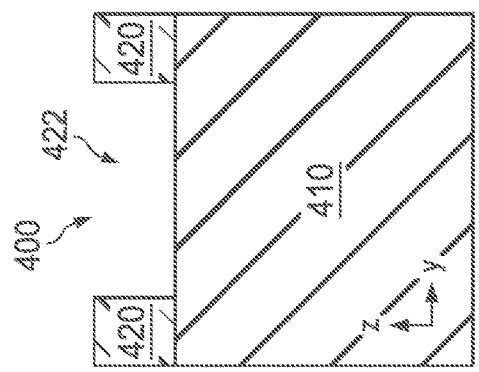

Turning next to FIGS. 5A-5C, the process may continue by depositing a photoresist 420 and patterning a mask opening 422 for extending in the x-direction from vertically-extending TFR side contact 408a to vertically-extending TFR side contact 408b and extending in the y-direction across the full or partial width (in the y-direction) of vertically-extending TFR side contacts 408a, 408b. In the illustrated example, the mask opening 422 is aligned such that the lateral ends of the mask opening 422 in the x-direction are aligned directly over vertically-extending TFR side contacts 408a and 408b. However, the disclosed process allows for some offset- or mis-alignment of the mask opening 422 in the x-direction without negatively effecting the subsequently formed TFR element between the TFR side contacts 408a and 408b. In particular, as discussed below with reference to FIGS. 11 and 12A-12B, each lateral edge 422a, 422b of the mask opening 422 may be aligned in the x-direction anywhere over the respective vertically-extending TFR side contact 408a, 408b, or even beyond the respective vertically-extending TFR side contact 408a, 408b in the direction away from the other vertically-extending TFR side contact 408a, 408b, without negatively effecting the subsequently formed TFR element 460.

Next, as shown in FIGS. 6A-6C, a trench etch is performed through the mask opening 422 shown in FIG. 5B to form a TFR trench 430 between vertically-extending TFR side contacts 408a and 408b. In some embodiments, a plasma etch, or alternatively a wet etch, may be used. After the trench etch, a resist strip and clean process may be performed, resulting in the structure shown in FIG. 6A-6C.

As shown, the TFR trench 430 exposes a sidewall 474a of vertically-extending TFR side contact 408a, and a sidewall 474b of vertically-extending TFR side contact 408b. As discussed below, a subsequently formed TFR element may include flanges formed in contact with these exposed sidewalls 474a and 474b.

The TFR trench 430 has an x-direction trench length LTFR trench defined by the distance between vertically-extending TFR side contacts 408a and 408b, a y-direction trench width $W_{TFR\_trench}$ defined by the y-direction width of the mask opening 422, and a z-direction trench depth DTFR trench defined by the relevant etch parameters (e.g., etch chemistry, time, without limitation). The trench width $WR_{TFR\_trench}$ trench and trench depth $D_{TFR\_trench}$ trench may define a contact area between vertically-extending flanges of a subsequently formed TFR element and each vertically-extending TFR side contact 408a, 408b, as shown in FIGS. 10A and 10B discussed below. This contact area may influence the contact resistance ($R_{TFR\ flange\text{-}TFR\ side\ contact\text{-}TFR\ head}$ discussed above) between the TFR element and each vertically-extending TFR side contact 408a, 408b, which may influence the overall resistance ($R_{contact:TFR\ element\text{-}TFR\ head}$ discussed above) of the resulting TFR module.

The trench length $L_{TFR\_trench}$, trench width $W_{TFR\_trench}$, and trench depth $D_{TFR\_trench}$ define the dimensions, and thus the performance, of the TFR element to be formed in the TFR trench 430. Thus, the trench length $L_{TFR\_trench}$, trench width $W_{TFR\_trench}$, and trench depth $D_{TFR\_trench}$ may be selected to provide desired performance characteristics of the resulting TFR module. The trench length LTFR trench may be selected by selecting or adjusting the x-direction distance between vertically-extending TFR side contacts 408a and 408b. The trench width $W_{TFR\_trench}$ may be selected by selecting or adjusting the y-direction width of the mask opening 422. The trench depth DTFR trench may be selected by selecting or adjusting the relevant etch parameters (e.g., etch chemistry, time, without limitation).

Figure 7A:
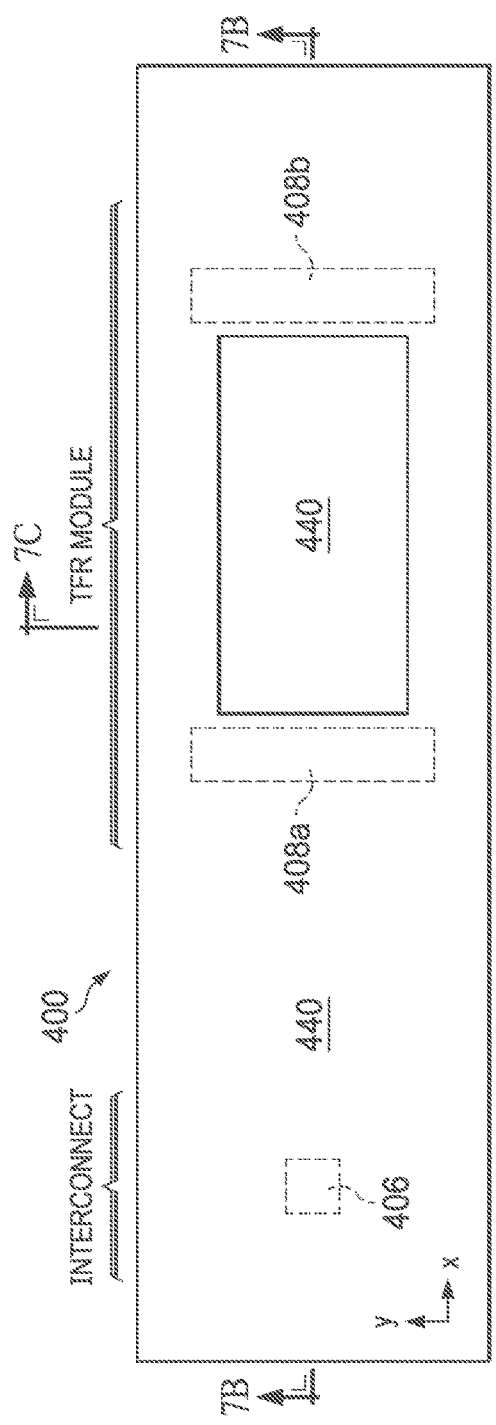
Figure 7B:
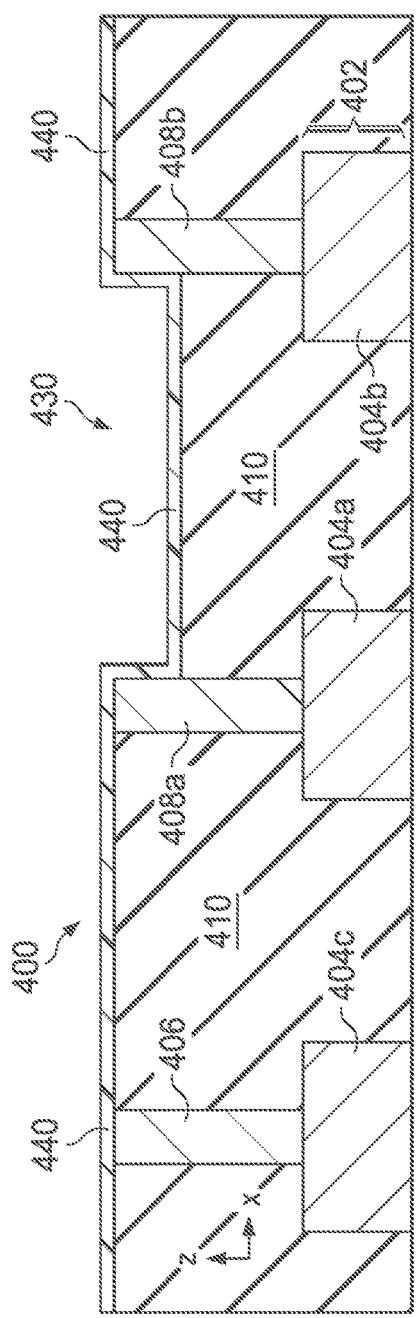
Figure 7C:
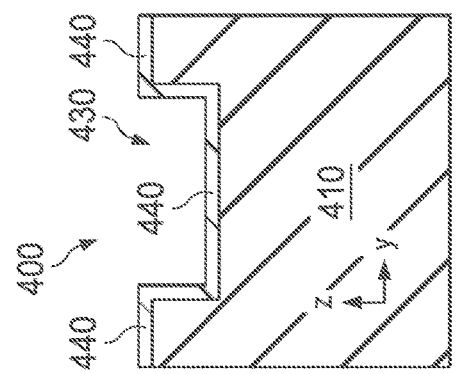

Next, as shown in FIGS. 7A-7C, a TFR film 440 is deposited over the structure and extending down into the TFR trench 430, e.g., by a physical vapor deposition (PVD) process. The TFR film 440 may comprise SiCCr, SiCr, NiCr, TaN, or any other suitable TFR element material, and may have a thickness of less than 100 Å (1 μm), e.g., in the range of 0.01-0.1 μm.

Figure 8A:
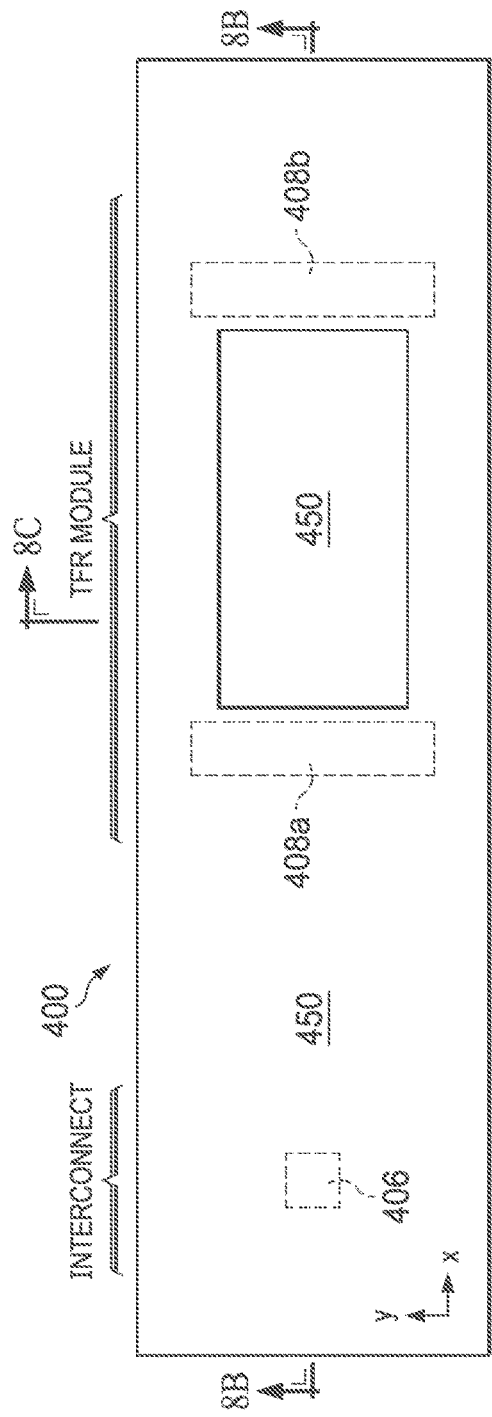
Figure 8B:
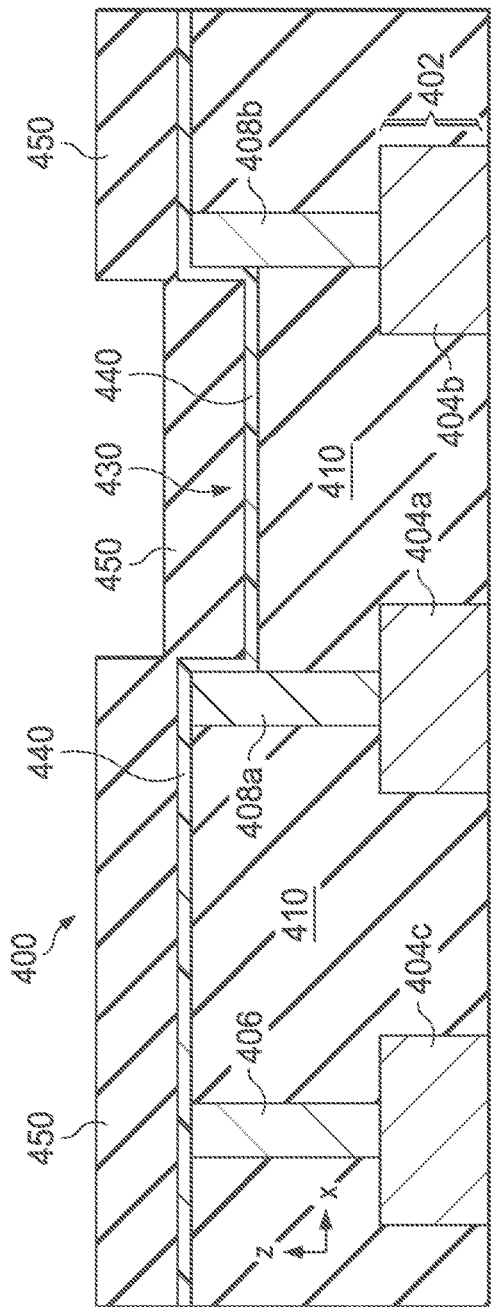
Figure 8C:
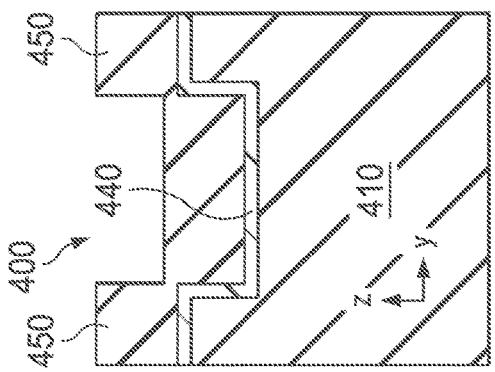

Next, as shown in FIGS. 8A-8C, a TFR cap 450 may be deposited over the TFR film 440 and extending into the TFR trench 430. The TFR cap 450 may comprise a nitride or oxide, for example, SiN or $SiO_2$, and may have a thickness in the range of 0.01-0.1 μm.

Next, as shown in FIGS. 9A-9C, a CMP may be performed to remove portions of the TFR cap 450 and TFR film 440 outside the TFR trench 430 and above the dielectric region 410. The remaining portions of the TFR film 440 define a TFR element 460, which includes:

(a) a laterally-extending TFR element base 462 extending from a first end 464a proximate first vertically-extending TFR side contact 408a to a second end 464b proximate the second vertically-extending TFR side contact 408b;

(b) vertically-extending TFR element end flanges 466a and 466b projecting vertically (upwardly) from the first and second ends 464a and 464b, respectively, of the TFR element base 462, and (c) TFR element side flanges 468a and 468b projecting vertically (upwardly) from opposing sides of the TFR element base 462.

The vertically-extending TFR element end flange 466a is formed on sidewall 474a of vertically-extending TFR side contact 408a, and the vertically-extending TFR element end flange 466b is formed on sidewall 474b of vertically-extending TFR side contact 408b. (Sidewalls 474a, 474b of vertically-extending TFR side contacts 408a, 408b were previously exposed by the trench etch discussed above with reference to FIG. 6B).

The TFR element side flanges 468a and 468b may create unwanted TCR effects for the TFR module, for example a TCR dependence on the TFR trench width ($W_{TFR\_trench}$), as described in U.S. Pat. No. 10,818,748, the entire contents of which are hereby incorporated by reference for all purposes. Thus, as discussed below, at least a portion of the TFR element side flanges 468a and 468b may be removed, to thereby reduce the TFR module's TCR dependence on the TFR trench width.

Referring next to FIGS. 10A-10C, a metal layer 480 is deposited, patterned, and etched using metal deposition, patterning, and metal etch techniques to form TFR heads 482a and 482b and metal line 482c, thereby completing the formation of the TFR module and interconnect structure, indicated respectively at 490 and 492. TFR cap 450 (for example, comprising SiN or $SiO_2$) protects the underlying TFR element base 462 from the metal etch. Metal layer 480 may be any metal layer (e.g., interconnect layer) at any depth in the IC device structure being formed. TFR head 482a is formed with a bottom surface 484a in contact with (a) first vertically-extending TFR side contact 408a and (b) a top (distal) end 470a of vertically-extending TFR element end flange 466a. Similarly, TFR head 482b is formed with a bottom surface 484b in contact with (a) second vertically-extending TFR side contact 408b and (b) a top (distal) end 470b of vertically-extending TFR element end flange 466b.

As mentioned above, TFR element side flanges 468a and 468b (FIGS. 9A-9C) of the TFR element 460 may create unwanted TCR effects for the TFR module. Thus, the metal etch used to form TFR heads 482a and 482b and metal line 482c may be used to remove a full or partial vertical height (z-direction) of the TFR element side flanges 468a and 468b outside the footprint of TFR heads 482a and 482b. For example, FIG. 10C shows openings 486a and 486b formed by the etching of the full height of TFR element side flanges 468a and 468b. In another example embodiment, the metal etch may remove a partial vertical height (z-direction) of the TFR element side flanges 468a and 468b outside the footprint of TFR heads 482a and 482b, such that the remaining (post-etch) TFR element side flanges 468a and 468b extend upwardly from the TFR element base 462, but to a lower height then the TFR element end flanges 466a and 466b.

In implementations in which the TFR heads 482a and/or 482b partially overlap the respective TFR element side flanges 468a and/or 468b, e.g., as indicated by overlap distance $O_{482a}$ and $O_{482b}$ in FIGS. 10A and 10B, the portions of the TFR element side flanges 468a and 468b in these overlap regions may be protected from the metal etch (by an overlying mask, as known in the art) and thus not removed. These protected, non-etched portions of TFR element side flanges 468a and 468b are shown in FIG. 10A at 468a', 468a", 468b', and 468b". In some implementations, TFR heads 482a and 482b may be aligned to provide no overlap over the respective TFR element side flanges 468a and 468b (i.e., overlap distances $O_{482a}$ and $O_{482b}$=0), such that the full length of the TFR element side flanges 468a and/or 468b in the x-direction may be removed during the metal etch. The TFR element end flanges 466a and 466b provide dual conductive paths between the TFR element 460 and TFR heads 482a and 482b, as discussed herein (e.g., above with respect to FIGS. 3A-3B).

In some embodiments, the metal etch may extend down into the dielectric (e.g., oxide) region 410, as indicated at 488.

Figure 11:
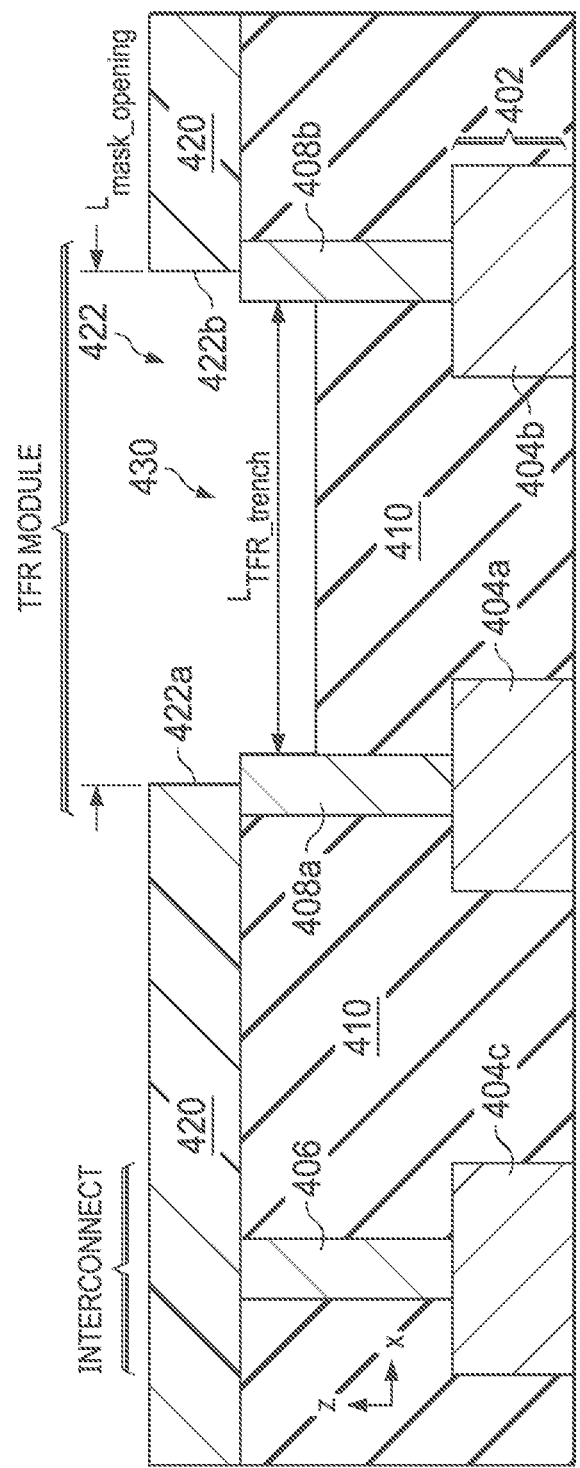
FIG. 11 is a cross-sectional side view showing a patterned mask opening well-aligned in the x-direction relative to underlying TFR side contacts, according to one example implementation.

As discussed above regarding FIGS. 5A-5C, the disclosed process may provide an alignment margin (in the x-direction) for the alignment of mask opening 422 patterned in photoresist 420, without negatively effecting the resulting TFR element 460. FIGS. 11 and FIGS. 12A-12B discussed below illustrate this concept.

FIG. 11 is a cross-sectional side view corresponding with FIG. 5B, showing a patterned mask opening 422 well-aligned in the x-direction relative to vertically-extending TFR side contacts 408a and 408b. As shown, the x-direction length of the TFR trench 430, $L_{TFR\_trench}$, in which the TFR film 440 is deposited to form the TFR element 460 (see FIGS. 7A-7C through 10A-10C), is defined by the distance between TFR side contacts 408a and 408b. The x-direction length of the patterned mask opening 422, $L_{mask\_opening}$, may be significantly longer than the TFR trench length $L_{TFR\_trench}$ without affecting the resulting TFR trench 430 and subsequently formed TFR element 460, as any portions of the TFR film 440 deposited outside the TFR trench 430 are removed as shown in FIGS. 9A-9C (or physically disconnected from the TFR film 440 within the TFR trench 430, as shown in FIG. 12B, discussed below), and thus do not affect the resulting TFR element 460.

Using a patterned mask opening length $L_{mask\_opening}$ longer than the TFR trench length LTFR trench provides an alignment margin for the alignment of the patterned mask opening 422 relative to vertically-extending TFR side contacts 408a and 408b, thus allowing a degree of misalignment of the patterned mask opening 422 (e.g., caused by misalignment of a photomask overlay, as known in the art).

FIGS. 12A-12B illustrate an example misalignment of the patterned mask opening 422, and absence of effect of such misalignment on the resulting TFR element 460, according to one example implementation. In this implementation the patterned mask opening 422, having the same x-direction length $L_{mask\ opening}$ as the well-aligned implementation shown in FIG. 11, is poorly aligned in the x-direction as indicated by the "misalignment" arrow.

FIG. 12A is a cross-sectional side view showing the misaligned mask opening 422 and resulting TFR trench 430 formed by the TFR etch through the misaligned mask opening 422. In this example, the lateral edge 422a of the misaligned mask opening 422 is aligned beyond the TFR side contact 408a in the x-direction away, which results in an additional trench 1202 formed beyond the TFR side contact 408a during the TFR trench etch.

FIG. 12B is a cross-sectional side view showing the resulting TFR element 460 formed in the TFR trench 430, after depositing a TFR film 440, depositing a TFR cap 450, and performing a CMP to remove portions of TFR film 440 and TFR cap 450 above the dielectric region 410, e.g., according to the process steps shown in FIGS. 7A-7C through 9A-9C. As shown, an additional region of TFR film material, indicated at 1204, extends down into the additional trench 1202 during deposition of the TFR film 440. However, after the CMP to remove portions of TFR film 440 and TFR cap 450 above the dielectric region 410, this addition TFR film region 1204 is physically detached from the TFR element 460 in the TFR trench 430, and thus does not affect the performance of the resulting TFR module.

As discussed above, a TFR module according to the present invention (e.g. TFR module 302 shown in FIGS. 3A-3B and TFR module 490 formed according to the process shown in FIGS. 4A-4C through FIGS. 10C-10C) may be formed at any depth in the relevant IC device structure. In some embodiments, the TFR module may be formed between any two metal layers in the relevant IC device structure, e.g., metal layers 310 and 312 shown in FIG. 3A, or metal layers 402 and 480 shown in FIG. 10B. In other embodiments, the TFR module may be formed between a silicided polysilicon layer and a metal layer (e.g., metal-1 layer) in an IC device structure.

Figure 13:
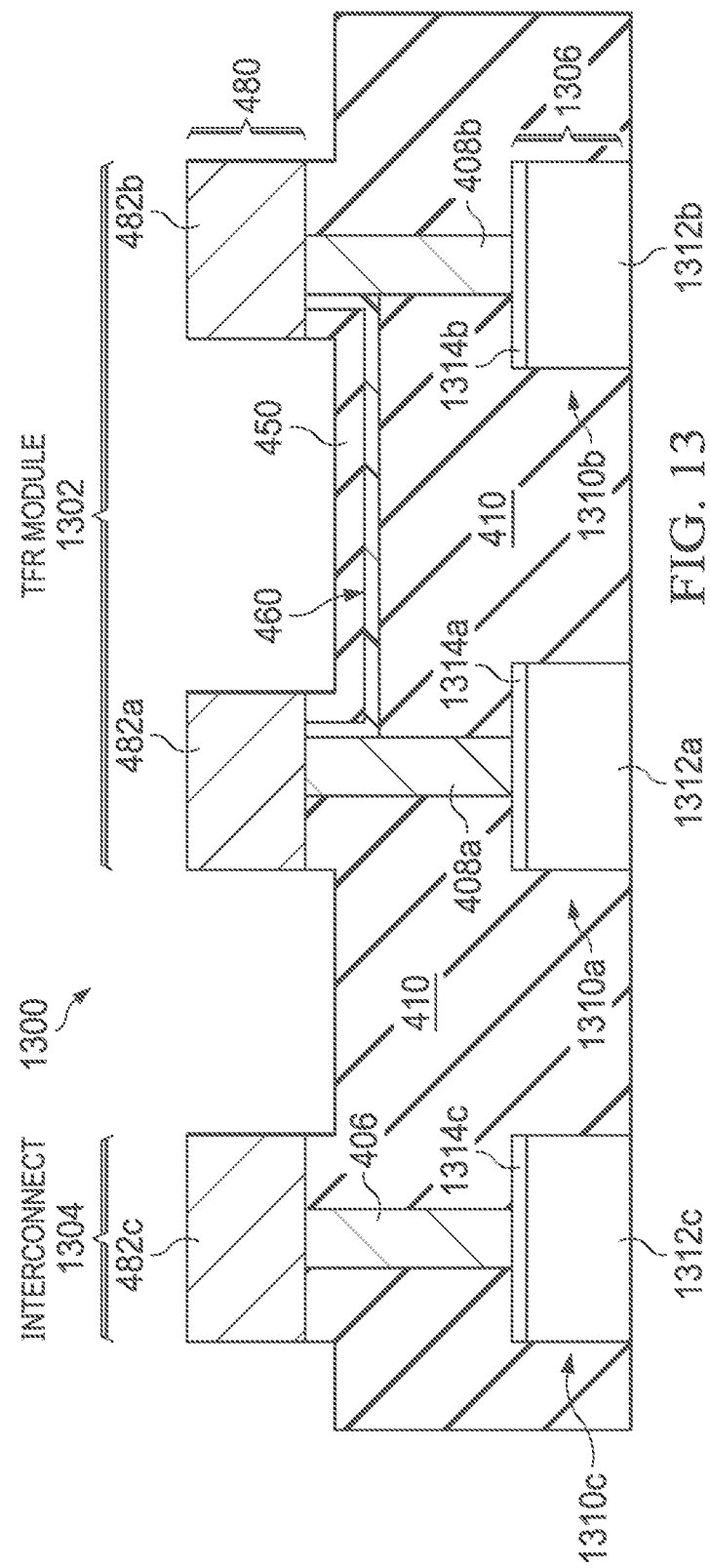
FIG. 13 shows a cross-sectional side view of an example IC device structure including a TFR module and interconnect structure formed between a polysilicon layer and a metal layer, according to one example embodiment.

FIG. 13 shows a cross-sectional side view of an example IC device structure 1300 including a TFR module 1302 and interconnect structure 1304 formed between a polysilicon layer 1306 and a metal layer 480 (e.g., metal-1 layer), according to one example embodiment. IC device structure 1300 is similar to IC device structure 400 shown in FIG. 10B, except the lower metal lines 404a-404c of IC device structure 400 are replaced by respective silicided polysilicon elements 1310a-1310c. Each polysilicon element 1310a-1310c includes a respective polysilicon element 1312a-1312c formed in polysilicon layer 1306, and silicided to form a silicide region 1314a-1314c on the top of each respective polysilicon element 1312a-1312c. Silicide regions 1314a-1314c may comprise of Titanium Silicide, Cobalt Silicide, or Nickel Silicide. Silicide regions 1314a and 1314b define conductive contacts for vertically-extending TFR side contacts 408a and 408b, respectively, and silicide region 1314c defines a conductive contact for via 406 of interconnect structure 1304.

The invention claimed is:

1. A method of forming a thin film resistor (TFR) module in an integrated circuit (IC) structure, the method comprising:
   forming first and second vertically-extending TFR side contacts spaced apart from each other in a dielectric region;
   after forming the first and second vertically-extending TFR side contacts, forming a TFR element between the first and second vertically-extending TFR side contacts, including:
   etching a TFR opening in the dielectric region between the first and second vertically-extending TFR side contacts, wherein a pair of opposing sides of the TFR opening are defined by opposing exposed sidewall surfaces of the first and second vertically-extending TFR side contacts, and wherein a length of the TFR opening is defined by a lateral distance between the opposing exposed sidewall surfaces of the first and second vertically-extending TFR side contacts;
   depositing a TFR film directly over the dielectric region and extending into the TFR opening; and
   removing upper portions of the TFR film to expose respective top surfaces of the first and second vertically-extending TFR side contacts;
   the TFR element including:
   a laterally-extending TFR element base extending from a first end proximate the first vertically-extending TFR side contact to a second end proximate the second vertically-extending TFR side contact;
   a first TFR element end flange projecting vertically from the first end of the TFR element base, the first TFR element end flange extending parallel to, and in contact with, the sidewall surface of the first vertically-extending TFR side contact, wherein a top surface of the first TFR element end flange is flush with the top surface of the first vertically-extending TFR side contact; and
   a second TFR element end flange projecting vertically from the second end of the TFR element base, the second TFR element end flange extending parallel to, and in contact with the sidewall surface of the second vertically-extending TFR side contact, wherein a top surface of the second TFR element end flange is flush with the top surface of the second vertically-extending TFR side contact; and
   forming a first TFR head in contact with both the top surface of the first vertically extending TFR side contact and the top surface of the first TFR element end flange, and a second TFR head in contact with both the top surface of the second vertically-extending TFR side contact and the top surface of the second TFR element end flange.

2. The method of claim 1, wherein the TFR element comprises SiCr, SiCCr, NiCr, or TaN.

3. The method of claim 1, wherein:
   the first TFR head is formed such that a bottom surface of the first TFR head is in contact with both the top surface of the first vertically-extending TFR side contact and the top surface of the first TFR element end flange; and
   the second TFR head is formed such that a bottom surface of the second TFR head is in contact with both the top surface of the second vertically-extending TFR side contact and the top surface of the second TFR element end flange.

4. The method of claim 1, wherein:
   the first TFR head is formed such that a bottom surface of the first TFR head is in contact with both (a) the first vertically-extending TFR side contact and (b) the first TFR element end flange; and
   the second TFR head is formed such that a bottom surface of the second TFR head is in contact with both (a) the second vertically-extending TFR side contact and (b) the vertically-extending second TFR element end flange.

5. The method of claim 1, wherein forming the TFR element further comprises:
  forming TFR element side flanges projecting vertically from the TFR element base and extending between the first and second TFR element end flanges; and
  removing at least a partial height of the TFR element side flanges.

6. The method of claim 5, further comprising performing a metal etch to both (a) define the first and second TFR heads and (b) remove the at least partial height of the TFR element side flanges.

7. The method of claim 1, wherein forming the first and second vertically-extending TFR side contacts comprises:
  forming first and second elongated via openings; and
  filling the first and second elongated via openings with metal.

8. The method of claim 1, wherein the deposited TFR film includes:
  (a) a first TFR film portion covering a top surface of the dielectric region and extending between the first and second vertically-extending TFR side contacts, the first TFR film portion defining the laterally-extending TFR element base;
  (b) a second TFR film portion covering the exposed sidewall surface of the first vertically-extending TFR side contact, the second TFR film portion defining the first TFR element end flange; and
  (c) a third TFR film portion covering the exposed sidewall surface of the second vertically-extending TFR side contact, the third TFR film portion defining the second TFR element end flange.

9. A method of forming an integrated circuit (IC) device including a thin film resistor (TFR) module and an interconnect structure, the method comprising:
  concurrently forming (a) a via and (b) first and second vertically-extending TFR side contacts in a dielectric region;
  after forming the via and the first and second vertically-extending TFR side contacts, forming a TFR element between the first and second vertically-extending TFR side contacts, including:
    etching a TFR opening in the dielectric region between the first and second vertically-extending TFR side contacts, wherein a pair of opposing sides of the TFR opening are defined by opposing exposed sidewall surfaces of the first and second vertically-extending TFR side contacts, wherein a length of the TFR opening is defined by a lateral distance between the opposing exposed sidewall surfaces of the first and second vertically-extending TFR side contacts;
    depositing a TFR film directly over the dielectric region and extending into the TFR opening; and
    removing upper portions of the TFR film to expose the respective top surfaces of the first and second vertically-extending TFR side contacts;
  the TFR element including:
    a laterally-extending TFR element base extending from a first end proximate the first vertically-extending TFR side contact to a second end proximate the second vertically-extending TFR side contact;
    a first TFR element end flange projecting vertically from the first end of the TFR element base, the first TFR element end flange extending parallel to, and in contact with, the exposed sidewall surface of the first vertically-extending TFR side contact; and
    a second TFR element end flange projecting vertically from the second end of the TFR element base, the second TFR element end flange extending parallel to, and in contact with, the exposed sidewall surface of the second vertically-extending TFR side contact; and
  concurrently forming (a) a metal line in contact with the via, (b) a first TFR head having a bottom surface in contact with both the first vertically-extending TFR side contact and the first TFR element end flange, and (c) a second TFR head having a bottom surface in contact with both the second vertically-extending TFR side contact and the second TFR element end flange.

10. The method of claim 9, wherein each of the first and second vertically-extending TFR side contacts comprises an elongated metal via.

11. The method of claim 9, wherein each of the first and second vertically-extending TFR side contacts has a TFR side contact width in a first lateral direction equal to a width of the via, and a TFR side contact length in a second lateral direction, the TFR side contact length at least twice as large as the TFR side contact width.

12. The method of claim 9, wherein forming the TFR element further comprises:
  forming TFR element side flanges projecting vertically from the TFR element base and extending between the first and second TFR element end flanges; and
  removing at least a partial height of the TFR element side flanges.

13. The method of claim 12, comprising performing a metal etch to (a) form the metal line in contact with the via, (b) form the first and second TFR heads and (c) remove the at least partial height of the TFR element side flanges.

* * * * *